United States Patent
Böthel

(10) Patent No.: US 6,557,157 B1
(45) Date of Patent: Apr. 29, 2003

(54) METHOD FOR DESIGNING COMPLEX DIGITAL AND INTEGRATED CIRCUITS AS WELL AS A CIRCUIT STRUCTURE

(76) Inventor: Andreas Frank Böthel, Sachsentr. 21, D-70435 Stuttgart (DE)

( * ) Notice: Subject to any disclaimer, the term of this patent is extended or adjusted under 35 U.S.C. 154(b) by 0 days.

(21) Appl. No.: 09/402,725

(22) PCT Filed: Apr. 8, 1998

(86) PCT No.: PCT/DE98/01019

§ 371 (c)(1),
(2), (4) Date: Jan. 7, 2000

(87) PCT Pub. No.: WO98/45794

PCT Pub. Date: Oct. 15, 1998

(30) Foreign Application Priority Data

Apr. 10, 1997 (DE) .......................................... 197 14 756
Jul. 19, 1997 (DE) .......................................... 197 31 043

(51) Int. Cl.$^7$ .............................................. G06F 17/50

(52) U.S. Cl. ............................... 716/18; 716/3; 716/5; 716/6; 716/7; 716/11; 716/19

(58) Field of Search ........................ 716/5–6, 18, 11, 716/17, 3, 7, 19; 714/724

(56) References Cited

U.S. PATENT DOCUMENTS

| | | | | |
|---|---|---|---|---|
| 5,257,363 A | * | 10/1993 | Shapiro et al. ............. | 395/500 |
| 5,263,169 A | * | 11/1993 | Genusov et al. ............ | 395/800 |
| 5,291,427 A | * | 3/1994 | Loyer et al. ................. | 364/578 |
| 5,325,309 A | * | 6/1994 | Halaviati et al. ........... | 364/488 |
| 5,463,562 A | | 10/1995 | Theobald | |
| 5,526,277 A | * | 6/1996 | Dangelo et al. ............ | 364/489 |
| 5,598,344 A | | 1/1997 | Dangelo et al. | |
| 5,671,150 A | * | 9/1997 | Maxwell ...................... | 364/488 |
| 5,930,148 A | * | 7/1999 | Bjorksten et al. ........... | 364/488 |

OTHER PUBLICATIONS

Fang et al. "A hierarchical functional Structuring and partitioning approach for multiple FPGA implementations" 1063–6757/96 IEEE 1996 p. 638–643.*
Ginetti et al. "A cell–based datapath synthesizer for ASICs" 0–7803–1375–5 IEEE 1993 p. 416–419.*
Ghosh I et al: "Design for Hierarchical Testability of RTL Circuits Obtained by Behavioral Synthesis" International Conference on Computer Design: VLSI in Computers and Processors, Austin, Oct. 2–4, 19956, Oct. 2, 1995, pp. 173–179.
Vuay Nagasamy et al.: "Specification, Planning, and Synthesis" IEEE Design & Test of Computers, Bd. 9, Nr. 2, Jun. 1, 1992, pp. 58–68.
Gajski D D et al.: "Introduction to High–Level Synthesis" IEEE Design & Test of Computers, Bd. 11, Nr. 4, Dec. 21, 1994, pp. 44–54..

(List continued on next page.)

Primary Examiner—Matthew Smith
Assistant Examiner—Granvill D Lee, Jr.
(74) Attorney, Agent, or Firm—Collard & Roe, P.C.

(57) ABSTRACT

The data flows of a system are allocated an arithmetic or logical function per function block (ALU-block), forming a RAM control. The ALU-blocks are specialized according to individual processing tasks of the data flows. The current status of the Ram address and RAM output data are recoupled with the ALU-blocks. During operation, the ALU-blocks alternately produce write accesses to the RAM and read accesses of all the ALU blocks can occur with every cycle, thereby controlling the outgoing signal lines of the data flows. Registers are inserted in such a way that the ALU-blocks are placed between register levels to ensure that test patterns are generated automatically with existing CAE programs. The low use of test structures guarantees that the base circuit has good testability with a minimal test pattern rate at an early stage of the circuit design. The inventive circuit structure can also be configured as a digital signal processor.

9 Claims, 6 Drawing Sheets

OTHER PUBLICATIONS

Man De H et a.: Architecture–Driven Synthesis Techniques for VLSI Implementation of DSP Algorithms: Proceedings of the IEEE, Bd. 78, Nr. 2, Feb. 1, 1990, pp. 319–335.

"Selbsttest digitaler Schaltungen", M. Gerner/B. Müller/G. Sandweg, Oldenbourg, pp. 68–73 (enclosed).

Design for Hierarchical Testability of RTL Circuits Obtained by Behavioral Synthesis, Indradeep Ghosh, Anand Raghunathan, and Niraj K. Jha, Int'l Conference on Computer Design: VLSI in Computers and Processors, Austin, Oct. 2–4, 1995, Oct. 2, 1995, pp. 173–179 (enclosed).

"Rechnerarchitektur (Computer Architecture)," $2^{nd}$ Edition, Wolfgang K. Giloi, Springer Verlag, Berlin, from p. 187, chapter "Superskalare Processors and VLIW Maschingen (Super Scalar Processors and VLIW machines)," well described, commencing on p. 194, sub point 6.3.3 "Motorola MC88110," specially figure 6–7 "Blockbild des Motorola Prozessors MC88110 (Block Diagram of the Motorola Processor 88110)," or sub point 6.6 "Die VLIW–Maschine (The VLIW Machine)," Figure 6–17 "Grundschema einer VLIW Maschine (Basic Scheme of a VLIW Machine)" (enclosed).

* cited by examiner

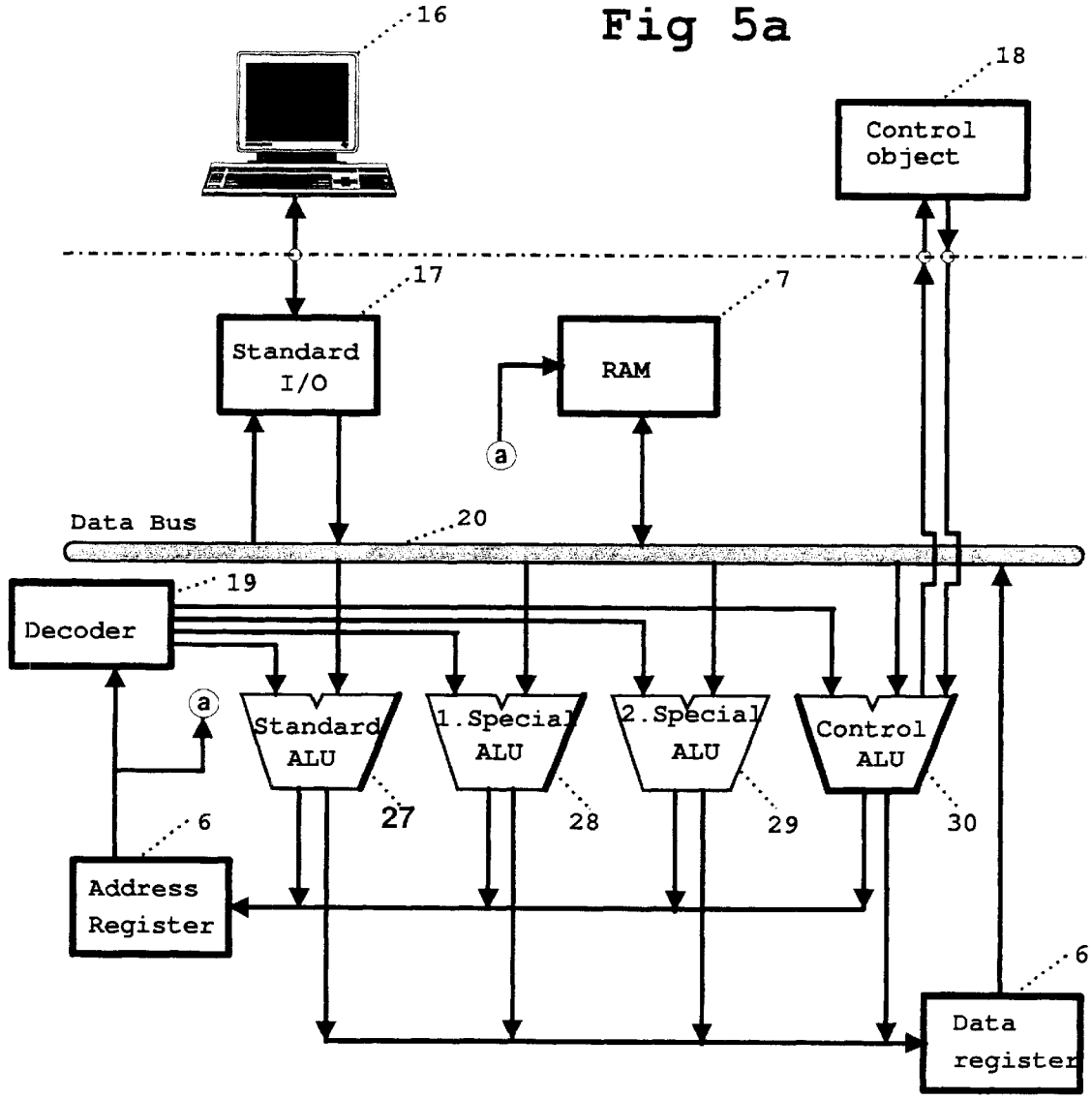

Principle of RAM Partitioning
of the write accesses of ALU
(with reference to Fig 4a)

METHOD FOR DESIGNING COMPLEX DIGITAL AND INTEGRATED CIRCUITS AS WELL AS A CIRCUIT STRUCTURE

CROSS REFERENCE TO RELATED APPLICATIONS

The applicants claim priority under 35 U.S.C. §119 of German application Nos. 19714756.9 and 19731043.5 filed on Apr. 10, 1997 and Jul. 19, 1997. The applicants claim priority under 35 U.S.C. §120 of PCT/DE98/01019 filed on Apr. 8, 1998. The international application under PCT article 21(2) was not published in English.

The invention relates to a method for designing complex digital integrated circuits for ensuring a testability of at least 95% error coverage with automatically generated test patterns.

Complex digital integrated circuits (ASICs) are in general comprised of pulse controlled element, hereinafter referred to as registers, RAM structures, as well as combinatorial elements. Methods for the design of complex digital integrated (ASICs comprise the following basic method steps:

preparation of a specification of the ASIC to be designed implementation of the specification with HDL languages, for example VHDL (HDL: hardware distribution language)

production of the ASIC circuit by means of ECAD software verification and delivery to the production/manufacture of the ASIC circuit.

The testability of an ASIC is required during the production phase of the ASIC so as to recognize in very short time defects that have arisen during the manufacture and to separate the ASIC which have defects.

The error coverage of an ASIC is the yard stick of how many internal line nets of an ASIC have to be subjected to quality control relating to defects during manufacture, particularly short circuit errors. The yard stick, also test coverage, is in practical experience about 95% of all internal line nets of an ASIC.

Test patterns describe cyclic condition sequences, which are applied at the input lines of an ASIC and which are awaited at the output lines of an ASIC in the event of an absence of errors.

Automatically generated test patterns are formed by test pattern generators, hereinafter ATPG (automatic test pattern generator). These ATPG are available as ECAD software or circuit-technologically realized, for the installation in the ASIC, for example, BIST cells (BIST: built-in-self-test). So that ATPG for a complex ASIC test pattern with high error coverage can compute, test structures need to be implemented (Literature reference: "Selftest Digital Circuits," M. Gerner/B. Müller/G. Sandweg, Publisher Oldenburg.)

In hitherto known design methods of ASICs, after the generation of the specification, which is in written form or already as model of the system, the circuit is produced, in that the detailed system implementation is done, via the combining of register, RAM structures, as well as combinatory elements is carried out in the equivalent sense.

In the case of a specification in written form the entire system is usually divided into a plurality of subsystems which, via HDL languages, are realized as sub modules with RTL syntax (RTL: register transfer level).

In the case of manual implementation these sub modules are verified separately, prior to incorporation into the overall design. When using automatic methods (U.S. Pat. No. 5,598,344), realized as ECAD software, there also is done a dividing operation (partitioning) of the entire system.

When the specification is at hand in the form of a suitable system model the synthesis-ready RTL model can be produced with ECAD tools, for example behavioral compiler of the firm Synopsys, Inc. ("Behavioral Compiler Methodology Note," Version 3.3a, April 1995, Synopsys, Inc.).

After one of the two outlined procedures has been concluded and the synthesis of the completed RTL model has been done, the circuit structure is at hand in the form of registers, combinatorial elements, RAM modules.

With this prerequisite the test structures can be fixed as to detail so as to ensure a utilization of ATPGs for the generation of test patterns with defined error coverage. This is done by inclusion of special test registers (scan registers), automatic test generators, especially for RAM cells (BIST cells). Also for this problem there exist automatic methods, for example, in U.S. Pat. No. 5,463,562, in which through automatic introduction of registers a testability of a circuit is to be attained. The inclusion of text multiplexers (test structures: see method claim 2) into an already finished implemented circuit structure (RTL design with connected registers and combinatorial elements), according to specified circuit function, described in "Designs for Hierachrical Testability of RTL Circuits Obtained by Behavioral Synthesis," Indradeep Ghosh, Anand Raghunathan, Niraj K. Jha, International Conference on Computer Design: VLSI in Computers and Processors, Austin, Oct. 2–4, 1995, Oct. 2, 1995, pages 173–179, Institute of Electrical and Electronics Engineers, avoids the appearance of non-testable areas in the design, for example, signals with constant signal level, combinatorial re-coupling and so on. It is to be remarked that this inclusion can only then arise when the time intensive system implementation (method step d)) has been done. Furthermore, other important design parameters, such as clock-skew, the effort consumption through method are not addresses since the method does not influence the structure/connection of the registers of the circuit structure to be changed. Another embodiment of realization of these automatic methods is the ECAD software test compiler of the firm Synopsys, Inc.

Due to the high specific area requirements of such test structures, particularly in the case of large ASIC circuits, in praxis one has developed the manner to use manually produced functional test patterns for attainment of the error coverage. For this purpose the firm Siemens AG developed the program system TOPS which guarantees that patterns produced during the system simulation are cycle oriented and, thus, test acceptable. These functional test patterns need to be examined, however, in a lengthy test simulation respective to their suitability of the error coverage.

In summary, it can be mentioned that in all known methods the structure of pulse controlled or storing elements, so register or RAM cells, to the finished productionof the circuit inclusive of the test structures in quantity and structure are not fixed. However, the just mentioned circuit elements affect in quantity and structure important ASIC design goals, such as testability, the execution/performance consumption, the requirement as to area, as well as the production effort in the layout phase.

Thus, the following points of criteria are seen in hitherto known design methods for ASICs:

1. Estimation of the circuit or, respectively, the project course, or the project cost, as criterion of the provision of development orders on the part of the customer are unclear at the commencement of the design. Particularly this applies to the required area as well as the performance consumption, since the amount of registers and RAM modules of the circuit is known just prior to delivery. There exists the danger of customer dissatisfaction, in some cases even the non-acceptance of the circuit by the customer. These risks cause direct or indirect high cost.

2. There exists the danger of a delayed delivery of the test patterns, Therewith in the ASIC production the production quality can not, be sufficiently subject to quality control examinations. Particularly then when using functional test patterns the suitability of which for error coverage needs to be examined in lengthy test siulations. Particularly this point needs to be observed in praxis. Through the delays of the production also arise high cost and dissatisfaction of the customer.

SUMMARY OF THE INVENTION

By using the method according to the invention as well as the circuit structure, it is possible to achieve the stated goals of the invention. The establishment of the register structures and RAM structures that are independent of functional implementation as shown in FIG. 1 box no. 3 relate to the definition of the clock structures as established in FIG. 1 box no. 4. With this prerequisite, the layout activities for the register structures and RAM structures can now be brought to a conclusion. This also includes verification of the register structures and RAM structures with regard to clock skew. In this connection it is obvious that the clock skew is significantly less than in comparable circuits since the RAM structures can be arranged in the layout with special separation from the combinatory elements, the implementation of which is generally complicated and time consuming, has no influence on clock skew, independent on how complex the system function based upon the specification. This also applies to the production test, since the fixed, defined number of register levels guarantees a uniform controllability i.e. observability of all the networks between the combinatory elements.

In contrast to special circuits, the circuit structure according to the invention as shown in FIG. 2 and FIG. 5, allows flexibility of the overall function of the ASIC after production. Selected functions can be structured so as to be configured via the RAM and selected using a microcode, via loading of the RAM.

In the method according to the invention qualified estimation of the required area, performance effort are to be possible, prior to implementing the system in detail to specifications. Thereby it is possible to advise the customer in an early phase of the design concerning the significant values/parameters, such that the customer is in a position to react in early manner.

Furthermore, during an early phase is to be ensured that the generation of the test patterns with an at least coverage of 95% exclusively known ATPGs are used. Special test problems need to be solved at an early stage.

One object of the invention is to use a method for designing digital ASIC circuits as well as a circuit structure for implementing the method, a circuit structure for processing several coded data streams (GSM, DECT, ATM, MIMD, etc.) which can also be implemented as a digital signal processor (DSP).

The goal of the invention is a compromise between the advantages of the stated design methods.

With regard to special circuits, complications in the ASIC layout (1) and the final verification are supposed to be avoided; these complications increase with the functional implementation of complex processing tasks. The following measures relate to these complications in the ASIC layout and are supposed to be carried out independently i.e. separate from the functional implementation of the specification:

Definition of the test structures and clock structures;

Definition of the number of register levels for verification of critical layout parameters, such as clock screw;

Furthermore, circuits according to the invention are supposed to have a flexibility of function after completion of the ASIC similar to DSP. With regard to MPS, the invention is supposed to have the following advantageous characteristics: 1) complete functional implementation of the specification with HDL models; and higher cycle frequency.

The aim is solved in accordance with the invention according to patent claim 22. The patent claims 23 to 27 refer to advantageous embodiments of the invention.

FIG. 5a shows the configuration of the circuit structure of a DSP; and

Figure 1:
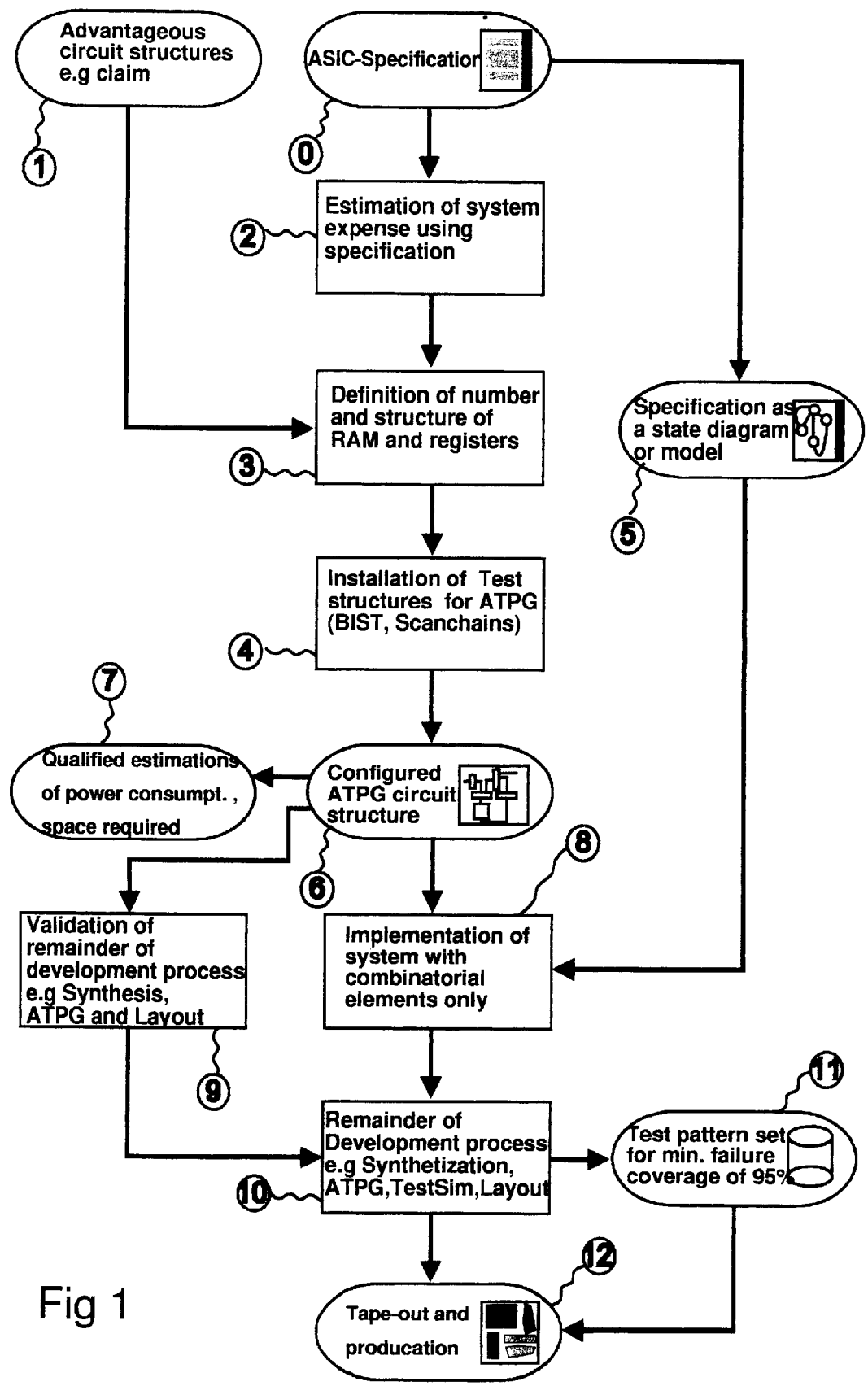
FIG. 1 shows an example of a sequence of the ASIC method according to the invention.

The following tables (Table 1 and Table 2) show the steps of the method (Table 1) and the results, in the following mile stones (Table 2), of the method in accordance with the invention of the preferred embodiment (compare FIG. 1)

TABLE 1

METHOD STEPS

| Short Designation (No. in FIG. 1) | Description |
| --- | --- |
| Circuit Estimation (2) | Estimation of the circuit effort on the basis of the ASIC Specification (0) |
| Circuit Configuration (3) | Fixing of the RAM and register cells as to quantity and structure on the basis of predefined circuit structure e.g. German Patent Application 197 14 756.9 (1) |
| ATPG Configuration (4) | Inclusion of test structures, such as BIST, scan register, test multiplexers and their connections, for assuring the ATPG function. |
| System implementation (8) | Based on the configured ATPG circuit structure (6) implementation on the basis of the advantageous form of the specification (5), with combinatoric only |
| ECAD Validation (9) | With the ATPG circuit structure (6) is done examination of ECAD software, such as synthesis, ATPG, test simulation, layout. |
| ECAD Design (16) | Production of finished circuit (12) as well as test pattern set (11) by means of ECAD software, such as synthesis, ATPG, test simulation, layout |

TABLE 2

MILESTONES

| Short Designation (No. in FIG. 1) | Description |
|---|---|
| ASIC Specification (0) | Textual description of ASIC system |
| Advantageous Circuit Structure (1) | for example as per claims 28–31 with predefined register/RAM structure |
| Model Specification (5) | For the implementation of advantageous form of the ASIC description (0) e.g. system descriptions in state diagrams. C-Model, etc. |
| Configured ATPG Circuit Structure (6) | ECAD usable circuit structure with established register/RAM structure and integrated ATPG test structure. |
| Qualified Estimation of effort (7) | qualify estimation concerning power consumption and area requirement |
| Test Pattern rate (11) | test pattern for the finished circuit (12) produced with ATPG and at least 95% error coverage |
| Finished circuit (12) | Design target, the finished circuit comprises at least the layout data, as well as the complete test pattern rate (11) |

In the following explanation of the method of the invention, reference is made—next to the methodshown in FIG. 1—to the drawings of the device (FIGS. 2 to 5b).

Prerequisite for commencement of the method in accordance with the invention (FIG. 1/Table 1/Table 2) is the preparation of a specification 0 which describes at least the functional behavior of the ASIC to be designed with textual means (see, for example, Tables 3 and 4.

Figure 2:
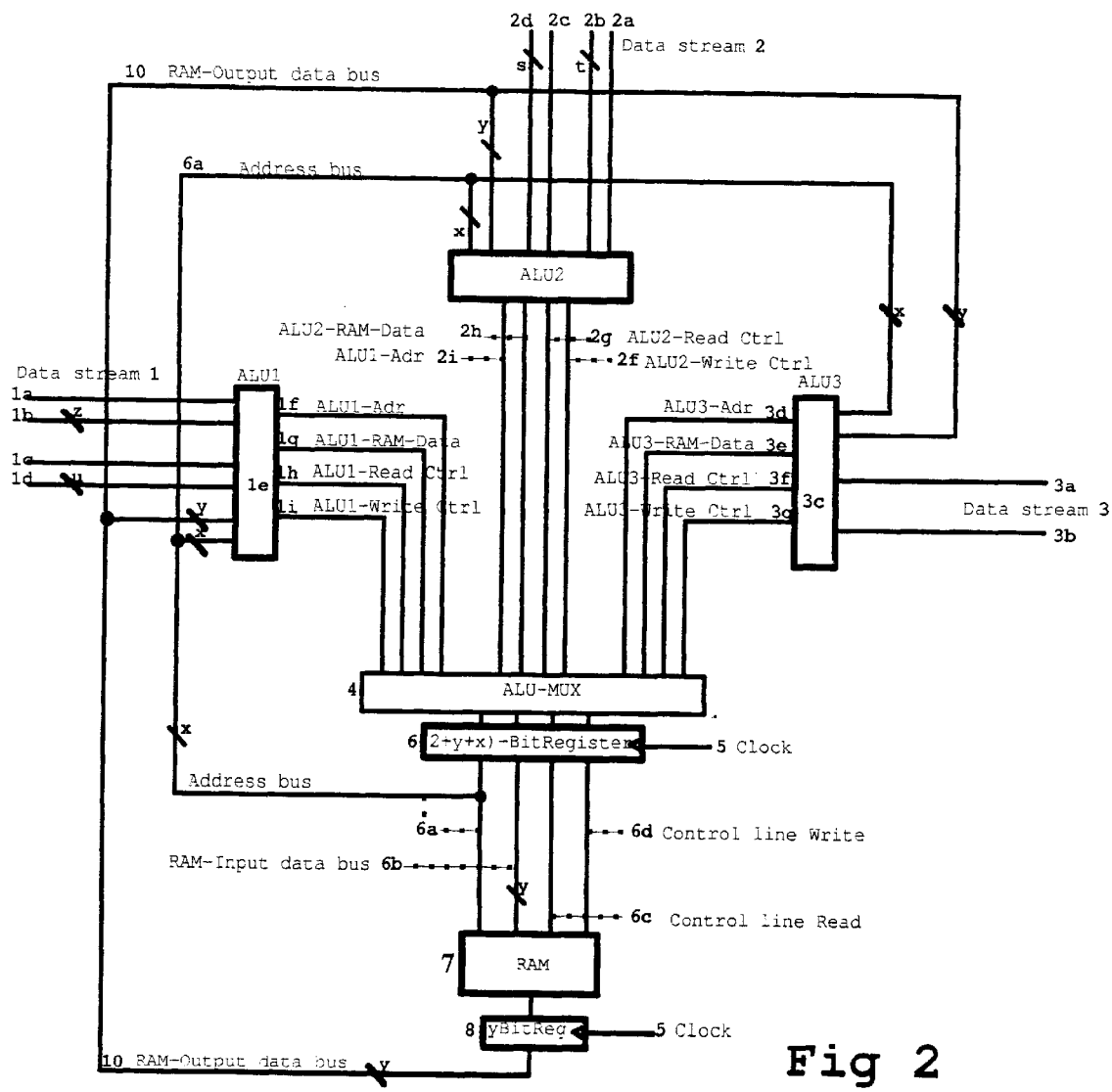
FIG. 2 shows the block diagram of the circuit structure, for implementing the method of FIG. 1.

From this ASIC specification 0, circuit estimation 2 of required register and RAM structures according to the expenditure of the invention follows (FIG. 2: 6, 7, 8).

This circuit estimation 2 is the basis of the circuit configuration 3 in which are fixed the register and ram cells as to quantity and structure into a functioning circuit FIG. 2: 4a–4c, 6, 6a, 6a–6b, 7, 9, 8, 10 as well as 5). This circuit is written in praxis usually with HDL language, for example, VHDL.

To this circuit are added, in this example, the test structures (also referred to as ATPG configuration 4). In these are included, for example, BIST cells for the RAM cells used, test multiplexers for the inputs and outputs of the ASIC, or scan registers. In praxis parts of the test structures are also included during the ECAD design 10 with ECAD programs, for example, Test Compiler of the firm Synopsys, Inc. Especially for scan registers and the associated connections to scan chains, this approach is preferred.

Upon ATPG configuration 4 the configured circuit structure 6 is at hand which represents a fully functional circuit. With this one can now make qualified estimates 7 since the performance and effort intensive circuit elements have been established FIG. 2; 6, 7, 8).

Furthermore, the remainder of the design process can be examined with this circuit (ECAD validation 9) so as to determine and eliminate time intensive errors during control of the ECAD software used already during an early phase. In praxis this validation can lead to a considerable savings in effort and to a limitation of the risk of the design.

Independently of the qualified effort estimate 7 and the ECAD validation 9, the manual time intensive system implementation 8 can now be carried out but only through combinatorial base elements (for example, for ALU3 FIG. 3: 11–15) inclusive of simulation of the system on the basis of the ASIC specification.

Figure 4:
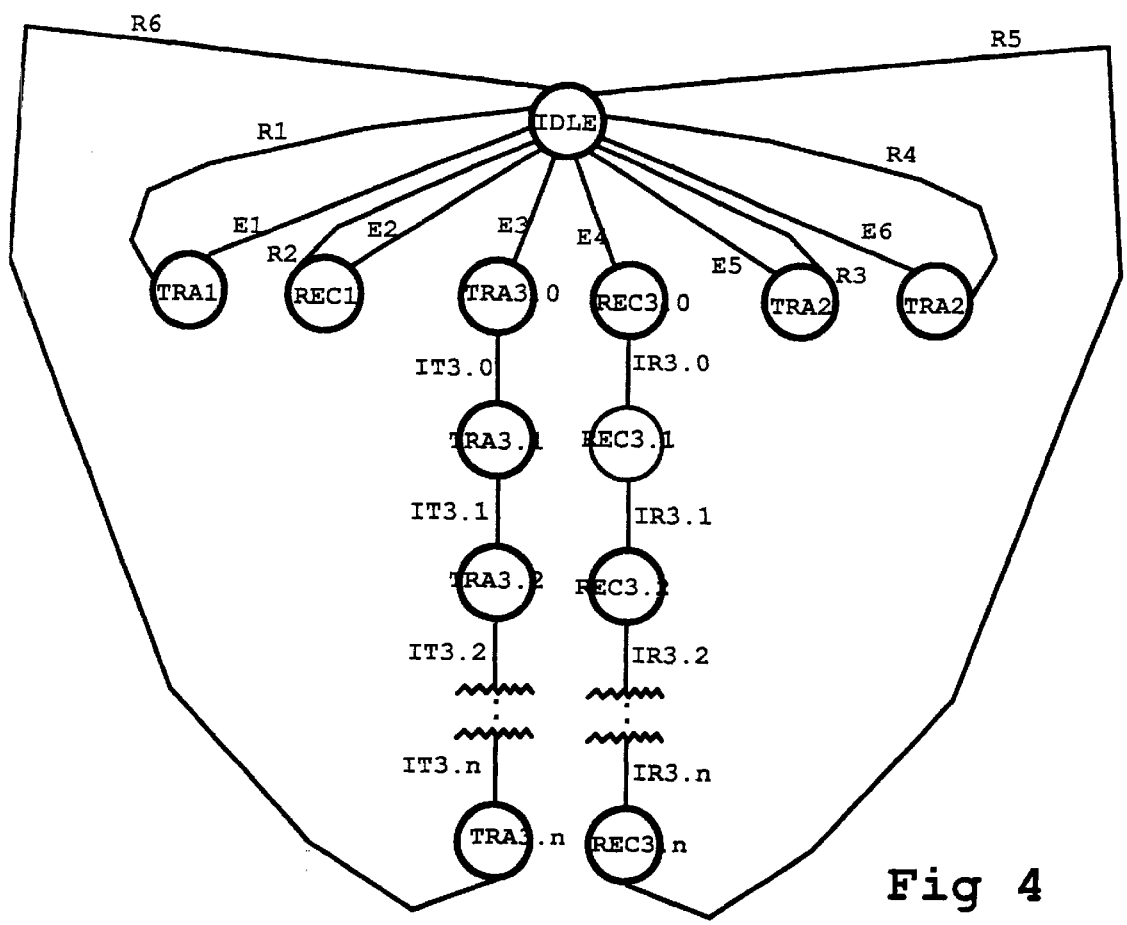
FIG. 4 shows a fundamental sequence for operation of the circuit structure.

For acceleration of the manual implementation, the ASIC specification can be brought into an advantageous form, for example a model specification 5 or system specification in state-diagram-form (FIG. 4).

Now follow the concluding tasks (ECAD design 10), such as synthesis, layout of the circuit to be implemented, as well as the generation of the test pattern set 11 with ATPG.

So as to ensure the quality during production of the ASIC along with the ASIC layout 12 is passed the test pattern set 11 to the production.

The invention furthermore relates to the circuit structure for processing of several data streams for describing or modeling digital circuits which can also function as digital signal processor, hereinafter DSP, as it is defined in claims 28 to 31.

The circuit structure with which the aforementioned steps can be carried out describes a template or an executed digital circuit for realization of digital circuits of named posing of task. Data streams are comprised of incoming, or, respectively, leaving signals of combined part functions of the entire function. Thereby exist either complex formats of data streams, for example a serial bit stream with a bi-coded data format, or only simple, parallel data buses as data streams, for example a digital signal processor.

Goals of production are comprised either in the processing of the complex formats of the data streams, for example, a decoding of a serial bit stream, or the execution of special operations for simple parallel data formats, for example, complex arithmetic operations in a DSP. Of course, there also exist combinations of the mentioned types of data streams and production related goals.

A description or a model of a circuit can mean, aside from a circuit diagram, also description in the register-transfer level, or behavior descriptions of any type, for example, in VHDL or Verilog. These can be converted with known means (circuit synthesis) into a circuit form with which a circuit-technological realization can be brought about.

Hitherto used realizations of digital circuits with the tasks described can generally be divided into two realization groups.

For one, realization can be brought for microprocessor systems, hereinafter MPS, which are generally comprised of the RAM, a register set, an ALU and a control logic, as well as peripheral connection options. A bus system connects the mentioned elements with one another (for example, in the laid open publications DE 36 36 095, DE 29 44 419, or in patent DE 43 12 090 C2).

In an MPS is brought about the realization of a task, in that the various data streams are associated to the peripheral connection options of an MPS, as well as the pre-occupation of the RAM unit with a micro code. These ensure that the MPS interrogates, sequentially, each individual condition of all incoming lines of the data streams and stores such in registers or RAM cells. With the aid of a central ALU or, respectively, a control logic new conditions of the output lines of all data streams are computed and modified. Therewith for the processing of the data streams only one ALU is used or, respectively, control logic for control of the RAM unit or of the registers. This means that the data streams are combined into a total data stream. Therewith the function of the individual ALU or, respectively, control logic has to solve all production tasks of the data streams to the same extent. The ALU or, respectively, the control logic is thus configured with relative simple arithmetic and logic functions such that differing complex production-processing functions of the individual data streams must be processed in many pulse steps.

In special configurations of MPS, so-called super scalar MPS or VLIW machines (VLIW: very long instruction word), there is done a parallelization of the arithmetic data manipulation with the aid of several ALU units. This allows to lower the number of pulse cycles. These ALU units, however, do not effect the operation of the RAM/register control. This is, as is the case with the simple MPS having only one ALU, exclusively centrally to be influenced. This means that, for example, for complex address calculations, the address data, via the ALU units, are initially modified as normal data information, and must be stored in an address register.

(Described in special literature "Rechnerarchitektur (Computer Architecture)," 2nd edition, by Wolfgang K. Giloi, Springer Verlag, Berlin, from page 187, chapter "Superskalare Processors nd VLIW Maschinen (Super Scalar Processors and VLIW machines)," well described, commencing on page 194, sub point 6.3.3 "Motorola MC88110," specially FIGS. 6–7 "Blockbild des Motorola Prozessors MC88110 (Block Diagram of the Motorola Processor 88110)," or sub point 6.6 "Die VLIW-Maschine (The VLIW Machine)" FIGS. 6–17 "Grundschema einer VLIW-Maschine (Basic Scheme of a VLIW Machine)" Comments: there (FIGS. 6–17) it can be seen well that the address information, as part of the control, can not be influenced via the "floating point" or "integer ALU" units.)

As the rule MPS are given as hardware, for example, as complete, micro chip, or as CAD system specification for inclusion in a larger ASIC (application specific integrated circuits) in the CAD design, in praxis also referred to as core or macro cell.

To the second group of realization belong digital circuits in which complex processing tasks are purely done in circuitry-technological mode. These types of the digital circuit are realized as a rule with a hierachiral design method (top down). Sub modules of the overall circuit are as a rule laid out as sequential condition machines, for example, as Mealy or Moore automats. These types of realization are referred to in the following as special circuit.

When the processing is realized in the form of an MPS as a rule the following drawbacks result. The processing of a data stream requires functionally mostly a plurality of pulse cycles. These are required so as to receive the information of all incoming signal streams, to store. Following reading of the micro code by the RAM this information is modified in the ALU and is presented so as to be available at the predetermined time again for the output signal streams. The strictly sequential processing arises through the use of one ALU only or, respectively, only one control logic (see super scalar or VLIW machines) with relative simple, generally usable logic or, receptively, arithmetic base functions, which are used for the processing of all data streams. This requires that the MPS needs to operate with a higher pulse frequency, relative to the highest frequency of a data stream. During design large requirements arise in respect to the delay times of the hardware to be employed. This leads to an increase in the effort consumption of the MPS or, respectively, the scope of use with high pulse rates. The MPS which are available are, furthermore, fixed systems with very limited adaptation possibilities which are used for the realization of special tasks. Therewith, MPS are in most cases over-dimensioned. This detrimentally affects the production cost.

The mentioned disadvantages of MPS realization can be avoided under certain conditions by special circuits. This affects, however, a flexibility of the control function since all processing steps need to be fixedly realized in circuitry manner. Upon completion of the entire circuit a change of the function is no longer available with simple means. This means that prior to the production of the circuit in praxis there needs to be expended an extensive effort in design time, of qualified personnel and cost intensive CAD design software, so as to minimize the risk of a faulty design. In the configuration of such a special circuit it is, furthermore, of disadvantage that the sub modules are realized as sequential condition machines. Therewith exist in the special circuit a plurality of condition registers, which are pulse-flank controlled, which are distributed in the realized circuit, for example, an ASIC layout in the circuit arrangement together with combinatorial circuit elements. This is of particular detriment during creation of a pulse connection to the condition registers. In this there easily arises the so-called clock-skew problem. Clock-skew is an undesired data shifting in pulse connections. Furthermore, the dynamic loss effort is increased as a function of the amount of pulse-flank controlled condition registers, which accounts form a predominant amount of the overall loss in effort. A further decisive point in the case of ASICs is the testability of a circuit during the production phase. In this it is the aim to ensure with a minimal amount of test vectors a lest coverage of production errors. In order to achieve this, it is necessary to enlarge the extant, functionally already complete special circuit by test structures. This, however, entails for a special circuit an appreciable enlargement of the final circuit area, the more processing steps of the data streams are existing.

It is the object of the apparatus invention to provide a circuit structure for processing several data streams from which a digital circuit can be described and modeled with a reduced design effort. This is also to ensure a flexibility of function after being finished. Furthermore, the required electrical operational consumption is to be reduced and the testability in an earlier phase of the design be ensured with a lowered effort of test structures. For step-wise processing of the data streams, only a few pulse cycles are required. The circuit should also be useful for many applications of the processing of data streams. Furthermore, a high degree of surveyability of the circuit is to be ensured through few sub modules so as to enable one with little special knowledge to modify an existing circuit.

Furthermore, the circuit structure represents the result of carrying out the method in accordance with the invention.

These objects are solved by a circuit structure according to patent claim 28. Patent claims 29 to 31 relate to advantageous embodiments.

Figure 3:
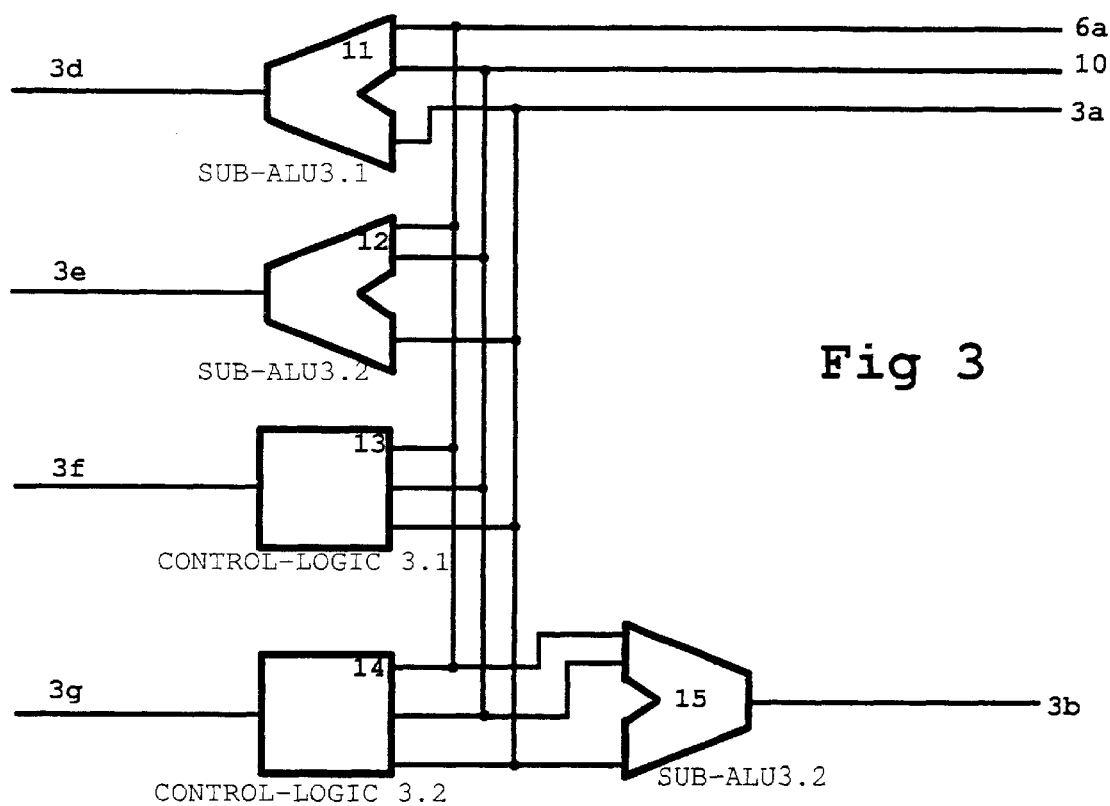
FIG. 3 shows the internal implementation example of an ALU with reference to FIG. 2.
Figure 5B:
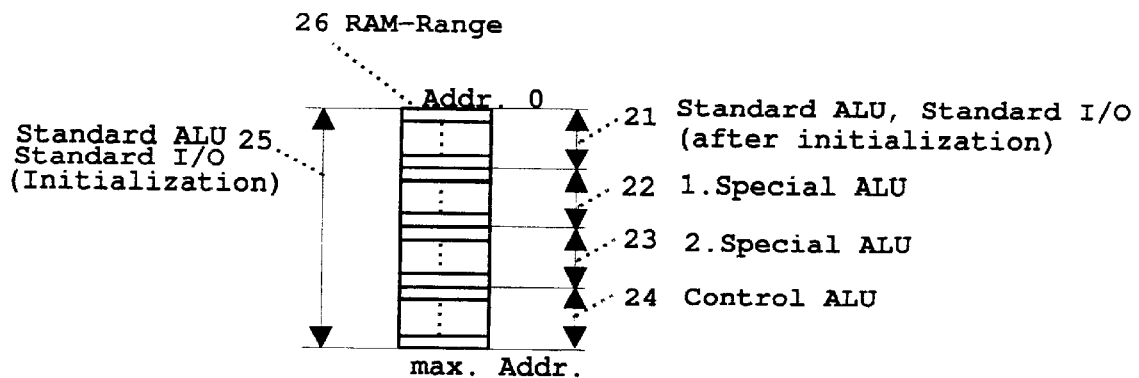
FIG. 5b shows an example of a RAM division for the ALU write accesses.

FIG. 2 shows a block diagram of the preferred embodiment,

FIG. 3 shows a sequence in principle of the operation of the circuit structure, FIG. 4 shows a sequence in principle of the operation of the circuit structure, FIG. 5a shows a circuit in principle of the circuit structure as DSP, FIG. 5b shows an example of a RAM division for the ALU write accesses (in reference to FIG. 5a).

As is shown in FIG. 2 the preferred embodiment of a circuit structure processes three data streams 1, 2, 3. The first data stream 1 is comprised of 2 (two) incoming signals with respectively one leaving (leav.) and arriving (arr.) 1-bit line 1a, 1c, as well as a leav. data bus 1d with a bus width of z. The second data stream 3 is comprised of an arr. 1-bit line 3a, as well as a leav. 1-bit line 3b. These data streams are associated to 3 (three) ALU units 1e, 2e, 3c which in their function are adapted to the processing tasks of the data streams. From each ALU respectively 2 (two) RAM control signals 1f, 1g, 2f, 2g, 3f, 3h which are passed to the module ALUX-MUX 4 as are the ALU address-1i, 2i, 3d and data lines 1h, 2h, 3c. In the module ALU-MUX 4 is done the combining of all inputs to respectively one control group comprised of the control signals 4c, 4d, as well as the address 4a and RAM input data bus 4b. Prior to their functioning as RAM inputs 6a, 6b, 6c, 6d a register stage 6 comprised of (x+y+2) registers is intermediately included, for example, D-flip-flops, which are controlled with pulse 5. The register outputs function as RAM control. As well, the address lines 6a are recoupled to the ALU units 1e, 2e, 3c. This also applies to the RAM output data 10, upon they also passing through a register stage 8 which comprises y registers, controlled with pulse 5. The RAM 7 comprises in customary manner a storage field, an address coder and a control logic.

In FIG. 3 is visible the interior realization principle of ALU 3c. The address bus 6a and the data output bus 10 and the ank. line 3a serve as inputs for the ALU3 components SUB-ALU3.1 11, for generation of the ALU3 address bus 3d. Via SUB-ALU 3.2 12 is done the generation of the ALU3 data input bus 3e. The control logic 3.1 13 provides the ALU3 control line "read" 3f. The control logic 3.2 14 serves to generate the ALU3 control line "write" 3g, as well as with SUB-ALU3.2 15 there arises the generation of the leav. line 3b. The ALU1 1e and ALU2 2e are realized in similar manner.

The following description refers to FIG. 4. From the base condition IDLE, to which is associated a start address can be converted in dependency of the appearing of different signals of the incoming data streams or the condition of the RAM data, E1–E6, in to the following conditions TR1A, REC1, TRA3.0, REC3.0, TRA2, REC2. This occurs thereby that to each condition is associated an address in the RAM range which computes the ALU. Now the external data can be loaded into addressed RAM range (REC1, REC3.x, REC2) or the data from this RAM range are made available via the output lines of the data streams (TRA1, TRA3.x, TRA2). Subsequently, in this example, return is made to the base condition IDLE. Thereby can be influenced again the RAM data of the start address, but also the leaving signal streams of the data streams (R1, R2, R3, R4, R5, R6).

Especially for the processing of the data stream 3 it may be added that during the condition interfaces (IT3.x or, respectively, IR3.x), aside from the pure storage of the sending a manipulation of the data can be carried out in which, for example, a data bit (a bit line of RAM output data bus 10) is coupled with the preceding data bit (another bit line from the RAM output data bus 10) via an XOR logic (realized in the SUB-ALU 3.2 12 and SUB-ALU 3.3 15, FIG. 3).

Respectively, in accordance with the condition (IT3.x or, respectively, IR3.x) this linking can be activated or de-activated. By way of this measure one can easily carry out, with little effort, special polynomial operations, for example, scrambling functions, CRC test functions, error corrections or encryption operations, which in many cases, for example, in DECT/GSM applications are required. The following tables detail the function course in reference to FIG. 4.

In Table 3 follows the listing of the conditions as well as their functional realization in the entire circuit. In Table 4 are listed all actions which are received by the individual condition changes are received or produced by the circuit.

TABLE 3

Description of the Conditions in FIG. 4

| Condition name/address | ALU 1e action | ALU 2e action | ALU 3c action |
|---|---|---|---|
| IDLE | receipt of arriving signals (1a, 1b) is active | receipt of arriving signals (2a, 2b) is active | receipt of arriving signals (3a) is active |
| TRA1 | computing of the new RAM data/address/control signals, as well as the leaving signals (1c, 1d) | reading of the actual RAM address/data computation of the leaving signals (2c, 2d) | no action |
| REC1 | processing of the arriv. signals (1a, 1b); computing of the new RAM data/address/control signals | reading of the actual RAM address/data computation of the leaving signals (2c, 2d) | no action |
| TRA2 | reading of the actual RAM/address/data computation of leaving signals (1c, 1d) | computation of the new RAM data/address/control signals as well as the leaving signals (2c, 2d) | no action |
| REC2 | reading of the actual RAM/address/data computation of leaving signals (1c, 1d) | processing of arriv. signals (2a, 2b); computation of the new RAM data/address/control signals | no action |
| TRA3.0 | no action | reading of the actual RAM address/data computation of the leaving signals (2c, 2d) | (a) computation of the new RAM data/address/control signals as well as the $1^{st}$ bit of the leav. signal (3b) |
| TRA3.1 | no action | reading of the actual RAM address/data computation of the leaving signals (2c, 2d) | computation of the new RAM data/address/control signals as well as the $2^{nd}$ bit of the leav. signal (3b) |
| TRA3.2 | no action | reading of the actual RAM address/data computation of the leaving signals (2c, 2d) | computation of the new RAM data/address/control signals as well as the $3^{rd}$ bit of the leav. signal (3b) |
| TRA3.n | no action | reading of the actual RAM address/data computation of the leaving signals (2c, 2d) | computation of the new RAM data/address/control signals as well as the nth bit of the leav. signal (3b) |
| REC3.0 | no action | reading of the actual RAM address/data computation of the leaving signals (2c, 2d) | processing the arriv. signals (3a); computation of the new RAM data/address/control signals for the $1^{st}$ bit |
| REC3.1 | no action | reading of the actual RAM address/data computation of the leaving signals (2c, 2d) | processing the arriv. signals (3a); computation of the new RAM data/address/control signals for the $2^{nd}$ bit |
| REC3.2 | no action | reading of the actual RAM | processing the arriv. com- |

TABLE 3-continued

Description of the Conditions in FIG. 4

| Condition name/address | ALU 1e action | ALU 2e action | ALU 3c action |
|---|---|---|---|
| REC3.n | no action | address/data computation of the leaving signals (2c, 2d) reading of the actual RAM address/data computation of the leaving signals (2c, 2d) | putation of the new RAM data/address/ control signals for the 3$^{rd}$bit processing the arriv. signals (3a); computation of the new RAM data/address/ control signals for the nth bit |

TABLE 4

Events for Change of Condition in FIG. 4

| Event Name | Output Condition | Trigger Condition | Sequence Condition |
|---|---|---|---|
| E1 | IDLE | defined condition of the RAM data (10) | TRA1 |
| E2 | IDLE | spacial condition of arriv. signals from data stream 1 (1a, 1b) | REC1 |
| E3 | IDLE | defined condition of arriv. signal from data stream 3 (3a) | TRA3.0 |
| E4 | IDLE | defined condition of the RAM data (10) | REC3.0 |
| E5 | IDLE | defined condition of the RAM data (10) | TRA2 |
| E6 | IDLE | defined condition of arriv. signal from data stream 1 (1a, 1b) | REC2 |
| IT3.0 | TRA3.0 | automatic | TRA3.1 |
| IT3.1 | TRA3.1 | automatic | TRA3.2 |
| IT3.2 | TRA3.2 | automatic | TRA3.3 |
| IT3.n | TRA3.n | automatic | TRA3.n |
| IR3.0 | REC3.0 | automatic | REC3.1 |
| IR3.1 | REC3.1 | automatic | REC3.2 |
| IR3.2 | REC3.2 | automatic | REC3.3 |
| IR3.n | REC3.n | automatic | REC3.n |
| R1 | TRA1 | automatic | IDLE |
| R2 | REC 1 | automatic | IDLE |
| R3 | TRA2 | automatic | IDLE |
| R4 | REC2 | automatic | IDLE |
| R5 | REC3.n | automatic | IDLE |
| R6 | TRA3.n | automatic | IDLE |

The foregoing descriptions relate to the realization principle of the circuit structure as alternative to special circuits (reference to FIG. 2, FIG. 3, FIG. 4). With reference to the special circuits, the circuit structure is characterized thereby that the required condition or data storages of a circuit to a large extent can be introduced into the RAM. It is useful that only global conditions are implemented in flank-controlled registers. These are here (FIG. 2) the address registers 6a. Through this arises for an ASIC layout with the circuit structure as basis the following advantages can be had in comparison with the known special circuits:

1. The effort input consumption of the entire circuit is limited since only few effort intensive flank-controlled registers are used.
2. The testability of the circuit structure is assured from the phase of setting the specification since the register structure is qualitatively fixed. These register can now in customary manner be exchanged by special test registers. Therewith is ensured an application of automatic test pattern generators (TPG), whereby the time for implementation of test patterns is essentially reduced and a minimal amount of test patterns per connection (Schaltung) is attainable. The observabilty of the connection during the test is good since the combinatorial elements are only between two register stages (6, 8).
3. The required area of the circuit is lower since a major portion of the system conditions and data are in the RAM range which is optimized in the area requirement (in the case of ASICs) since only few (test) registers exist and because a large portion of al utilized combinatorial elements are positioned between two register stages. This will allow with relative simple means of Boolean algebra to eliminate redundant combinatoric. This is usually done automatically by way of synthesis program when the circuit is present as syntheziable specification, VHDL or Verilog. In the case of special circuits the combinatorial elements are positioned between many register stages.)
4. Through the spatial separation of combinatorial elements and the combined structures of the registers are avoided problems in the ASIC layout (see clock-skew).
5. The circuit structure is particularly simply implemented with HDL programming languages, VHDL or Verilog, since only few sub modules are extant. Thereby can be implemented the ALU sub modules also by designers with relative little knowledge of the mentioned HDL programming languages. Furthermore, it is there through possible to produce samples (templates).
6. The circuit structure can be designed so as to be flexible in function. This is a function of how special the individual ALU functions are designed for the processing task. Relatively simple ALU functions can more universally process processing tasks thereby that the RAM contents can be processed as micro code MPS-alike. Through a modification of the micro code can then be influenced the functional course also after the manufacture as ASIC. A data stream with ALU can takeover the function of loading, for example, of an initial condition, or, respectively, a reading of the RAM content.

The just described point 6 is the commencement point of a further applicability of the described circuit structure. It is pointed to the fact that even a circuit structure with little flexibility, i.e., near to that of a special circuit, has the named advantages (see points 1 to 5).

The circuit structure which is similar in functional manner and configuration to an MPS or a DSP is shown in principle in FIG. 5*a*. Hereby are used special arithmetic functions as processing tasks of the data stream with the same format. It is shown a structure with 4 ALU blocks whereby an ALU 27 exists which has customary functionality and which serves, with priority, the interface to standard in/outputs 16, 17. Furthermore, there exist 2 special ALU blocks 28, 29 which are capable of processing the special arithmetic operations with low cycles as compared to the standard ALU 27. The 4th ALU block is the ALU with the specialized function. This is here to operate an external control object 18 and, thus, represents the control function of a control chain. All data are here passed on a data bus 20. Furthermore in all ALU functions (27, 28, 29, 30) the address control of this DSP is influenced.

For the principle representation of function of this DSP circuit/control principle serves FIG. 5*b*, which orders the write accesses in the RAM 7. The standard ALU 27 or, respectively, standard E/A 17 have in an initialization phase write access 25 over the full range of RAM 26. Thus, predeterminations can be made, for example, for the control ALU 30. Upon initialization this write access is limited to a portion of the RAM range 21. The ALU blocks 28, 29, 30 can access always only over the limited RAM ranges 22, 23, 24.

Through this functional principle the special ALU functions can take over the tasks of co-processors which are customarily. tied parallel to the MPS. By realization of such DSP structures it is surely useful to develop corresponding compilers or, respectively, linkers so as to optimize the program performance. As decisive advantage is seen the lowering of the pulse rate when compared with conventional DSP/MPS because external data streams have direct access via the ALU blocks to the RAM.

What is claimed is:

1. A method for designing complex digital and integrated circuit structures, consisting of register cells and RAM cells as well as of combinatory basic elements, referred to as an ASIC hereinafter, the method having the following steps:
   a) creating an ASIC specification which describes the functional behavior of the ASIC to be designed;
   b) estimating an expenditure in reference to the required register and RAM structures on the basis of the specification and fixing said register and RAM structures into one configured circuit structure, and
   c) implementing the combinational base elements and addition thereto of the same to the circuit according to step b, until a complex digital circuit structure is formed that satisfies the required specified functions.

2. Method according to patent claim 1, wherein said step of estimating an expenditure in reference to the required register and RAM structures further comprises the steps of building into the configured circuit structure a plurality of test structures necessary to generate automatically generated test patterns wherein one summarizable unit of a test structure operates the memory unit; and inserting additional test structures into the configured circuit structure so that other logic elements and connections of this circuit structure can be observed.

3. Method according to patent claim 1, wherein said step of estimating an expenditure in reference to the required register and RAM structures further comprises the step of processing the circuit structure via ECAD tools for logic synthesis and ASIC layout wherein this processing step includes validating the circuit structure.

4. Method according to claim 1, further comprising the step of estimating a power consumption of the ASIC based upon a circuit structure wherein a total power is determined from a dynamic power loss of a plurality of cycle controlled elements in the ASIC that are dependent on a plurality of cycle frequencies generated in the ASIC.

5. The method as in claim 1, wherein said step of implementing the combinational base elements includes creating a specification in model form that is advantageous for system implementation and controls an ECAD software that implements a plurality of combinatory elements in the ASIC.

6. A circuit structure to describe or model digital circuits comprising the following characteristics to process several data streams:
   a) a plurality of functional ALU units that are formed by a plurality of combinatory basic elements such as logic or arithmetic ALU which include a plurality of ALU inputs and a plurality of ALU outputs;
   b) a memory unit comprised of a RAM for storing digital information and a plurality of cycle controlled registers which include a plurality of register outputs and a plurality of register inputs;
   c) a plurality of feedback branches disposed in said plurality of cycle controlled registers wherein said plurality of cycle controlled registers are arranged so that said plurality of register outputs are linked with said ALU inputs via said feedback branches, whereby a change in a state and control of a plurality of output lines is brought about whereby the change in state is cycled into said register inputs by a step by step process; and
   d) a unit for bringing lines together, wherein said unit is disposed between said ALU outputs and said registers;
   wherein said data stream has outgoing and incoming lines, and wherein said digital signals are coded so that every data stream has an ALU assigned to it, wherein this ALU assigned to the data stream has a special processing task and the ALU in each instance generates the control and the input data for the RAM or register, respectively to change the state where the RAM region can be divided into partial regions, with only one ALU being assigned to each of these regions.

7. The circuit structure according to patent claim 6, wherein a minimal amount of pulse controlled register stages are inserted in such a manner that all of said combinatory elements are positioned in the signal path between the register outputs and register inputs.

8. The circuit structure according to patent claim 6, wherein the ALU units produce in alternating manner a write access to a RAM.

9. The circuit structure in accordance with patent claim 6, wherein the circuit structure serves as a pattern or as an HDL model from which digital circuits are created or simulations are carried out.

* * * * *